(12) United States Patent
Evers et al.

(10) Patent No.: US 6,615,547 B2
(45) Date of Patent: Sep. 9, 2003

(54) LOCK FOR VACUUM CHAMBER

(75) Inventors: Marinus Franciscus Johannes Evers, Geldrop (NL); Michael Adrianus Theodorus Hompus, Helmond (NL)

(73) Assignee: O.T.B. Group B.V., Eindhoven (NL)

( * ) Notice: Subject to any disclaimer, the term of this patent is extended or adjusted under 35 U.S.C. 154(b) by 0 days.

(21) Appl. No.: 09/902,617

(22) Filed: Jul. 12, 2001

(65) Prior Publication Data

US 2002/0021542 A1 Feb. 21, 2002

(30) Foreign Application Priority Data

Jul. 12, 2000 (NL) .............................................. 1015690

(51) Int. Cl.$^7$ ................................................ E06B 3/00
(52) U.S. Cl. ...................................................... 49/507
(58) Field of Search ............................................ 49/507

(56) References Cited

U.S. PATENT DOCUMENTS 4,676,884 A  6/1987 Dimock et al.
4,842,683 A * 6/1989 Cheng et al. ................ 156/345
5,451,131 A  9/1995 Hecht et al.

FOREIGN PATENT DOCUMENTS

JP  07 292 470  11/1995

* cited by examiner

Primary Examiner—Jerry Redman
(74) Attorney, Agent, or Firm—Young & Thompson

(57) ABSTRACT

Lock for a vacuum chamber which lock has a passage comprising an outer sealing element and an inner sealing element which outer sealing element can be maintained in the closed position under the influence of the pressure difference caused by the vacuum in the vacuum chamber, and can be opened against the force caused by the pressure difference, which inner sealing element under pretension can be maintained in the opened position and comprises closing element for closing the inner sealing element against the pretension, the closing element comprise at least one electromagnet.

17 Claims, 3 Drawing Sheets

LOCK FOR VACUUM CHAMBER

BACKGROUND OF THE INVENTION

The invention relates to a lock for a vacuum chamber which lock has a passage comprising an outer sealing means and an inner sealing means which outer sealing means can be maintained in the closed position under the influence of the pressure difference caused by the vacuum in the vacuum chamber, and can be opened against the force caused by said pressure difference, which inner sealing means under pre-tension can be maintained in the opened position and comprises closing means for closing the inner sealing means against said pre-tension.

By means of such a lock products can be transferred between the inner space of the vacuum chamber and the surrounding thereof, namely in such a manner that the vacuum is maintained. In the vacuum chamber various operations can be performed onto the product. More specifically one may think of applying a metal layer by means of a sputtering operation onto a substrate such as a CD-disc or DVD-disc.

In the known lock the inner sealing means is maintained in the closed position in a mechanical manner. Therefore, a pushing rod has to be applied which has to be operated from the outside through the wall of the vacuum chamber. Such a way of handling will lead to problems, which can influence the operation of the vacuum manner in a disadvantageous way. It appears not to be easy to displace the inner sealing means plan parallel in the correct way such that the required seal is indeed obtained for maintaining the vacuum. A further problem is that the seal of the pushing rod in relation to the wall of the vacuum chamber cannot always be maintained.

SUMMARY OF THE INVENTION

Object of the invention is now to provide a lock of the above-mentioned type, which does not have said disadvantages. Said object can be reached in case the closing means do comprise an electromagnet.

By means of the electromagnet the inner sealing means can be operated without the necessity of a mechanical transfer through the wall of the vacuum chamber. Therefore, sealing problems are eliminated. Furthermore the required parallel movement of the inner sealing means is obtained by the co-operation of the electromagnet with for instance a pole piece. For that purpose the electromagnet may extend around said passage and the pole piece may extend over the inner sealing means in a corresponding way. Especially the passage and the outer and inner sealing means can be cylindrical.

To improve the co-operation between the electromagnet and the pole piece, the pole piece has at the surface directed to the electromagnet least one annular ridge or groove, and the area around the passage has at least a correspondingly situated groove respectively ridge, which ridge can be inserted into said groove in case the passage is closed by means of the inner sealing means. The ridge and groove will take care for a correct mutual positioning of the inner sealing means and the passage.

Instead of a pole piece also a second electromagnet or permanent magnet can be provided.

The outer sealing means comprises an annular O-seal, which under the influence of the vacuum is maintained pressed on, the inner sealing means has an annular O-seal which under the influence of the activated electromagnet can be maintained pressed on.

The invention furthermore relates to a vacuum chamber, such as a sputter device, comprising at least one lock, which lock has a passage comprising an outer sealing means and an inner sealing means, which outer sealing means can be maintained in the closed position under the influence of the pressure difference caused by the vacuum in the vacuum chamber and can be maintained opened against the force generated by said pressure difference, which inner sealing means can be maintained in the open position under pretension and comprises locking means for closing the inner sealing means against said pretension, which vacuum chamber comprises a table, which table is displaceable along the passage and carries said inner sealing means. The closing means do comprise an electromagnet and a pole piece, a second electromagnet or a permanent magnet.

In a preferred embodiment said vacuum chamber comprises a drum-shaped housing with cylindrical surrounding wall as well as two walls at both ends of said cylindrical surrounding wall in one of which a cylindrical passage is made with an outer vacuum cap, in which housing a table with circular surrounding is mounted in a coaxial rotatable manner.

BRIEF DESCRIPTION OF THE DRAWINGS

Hereinafter, the invention will be explained in more detail with reference to an embodiment, which is illustrated in the figures.

DETAILED DESCRIPTION OF THE PREFERRED EMBODIMENTS

Figure 1:
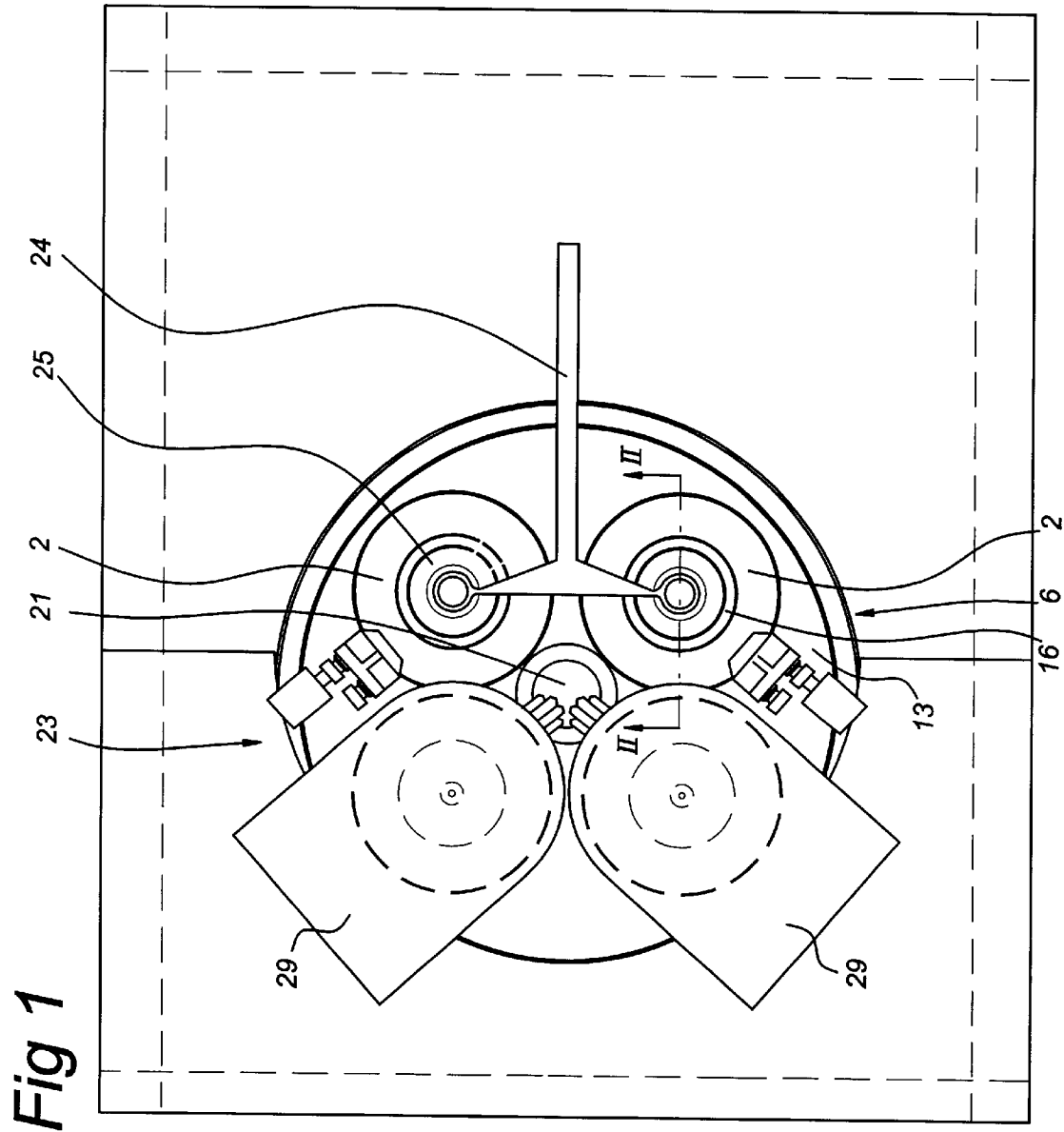
FIG. 1 shows an upper view on a sputtering device with a lock according to the invention.

In FIG. 1 an upper view is provided of the vacuum device which in general is indicated by 23, such as a sputtering device, as well as a load and emptying device 24. This last-mentioned device comprises gripping means 25 each able to grip a disc 16 and transport said disc between said sputter device and other, not illustrated stations. In the provided embodiment a pair of gripping devices 25 is positioned above a pair of locks according to the invention, ready to insert a disc into the sputtering device or to remove the disc therefrom. After inserting the discs, the discs are transported over 180° in the sputter device 23 until they are underneath the sputtering apparatuses 29. After the operation of the discs is performed they are again transported over 180° and removed by means of a pair of gripping devices 25.

Inserting and removing the discs 16 is done through a pair of locks, which are present in the upper wall 13 of the vacuum chamber 6. In respect to the production rate it is desirable to maintain the vacuum in the vacuum chamber even when the discs are changed. For that purpose the locks are present.

Figure 2:
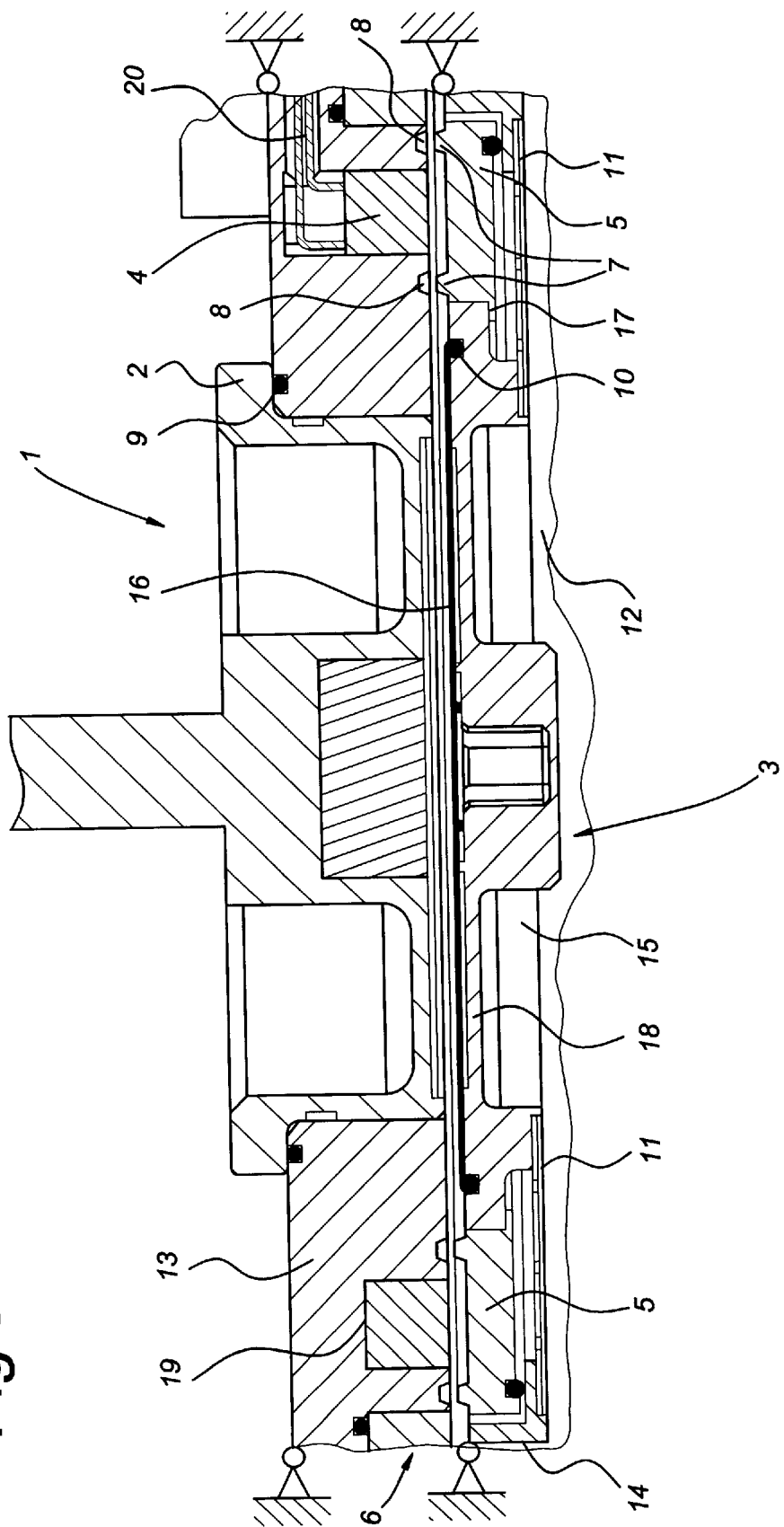
FIG. 2 illustrates a transversal cross section according to II—II in FIG. 1 of the lock.

The lock illustrated in FIG. 2 forms part of the vacuum chamber 6, of which only part of the upper wall 13 as well as the turning table 12 are indicated in cross section. The turning table 12 comprises a circular circumferential edge 14 and is at its center 21 (see FIG. 1) rotatably mounted in the vacuum chamber 6.

The vacuum chamber 6 comprises in the upper wall 13 a passage, which is closed by means of the vacuum cap 2. This vacuum cap 2 operates by means of the O-seal 9 together with the area of the upper wall 13 around the passage 1. The vacuum cap 2 can be brought in the opened or closed position by (not illustrated) operating means.

In the inner space 15 of the vacuum chamber 6 in which a vacuum can be maintained by means of vacuum means 22 (see FIG. 1), the table 12 is rotatably installed. This table 12 carries an inner sealing disc 3 onto which a substrate, such as a plastic blank for a CD or DVD is located.

The sealing disc 3 comprises a core 18 around which the annular pole piece 5 is installed. As indicated said pole piece 5 comprises an outstanding section 17 which reaches under the core 18. The core 18 furthermore carries an O-seal 10, which in a manner to be described hereinafter is able to co-operate with the wall 13 of the vacuum chamber 6.

In the situation, illustrated in FIG. 2, the vacuum cap 2 is closed and a substrate to be operated is present on the inner sealing disc 3, especially on the core 18 thereof. During inserting or removing of the disc 16 in or out the chamber 6 the sealing cap 2 has to be removed to make the passage 1 free. To be able to maintain the vacuum in the vacuum chamber 6 the inner sealing disc 3 has to be moved upwards such that the O-seal 10 will sealingly be pressed against the upper wall 13. For that purpose the upper wall 13 carries an annular electromagnet 4 in a groove 19 in the upper wall 13. Said electromagnet 4 can be supplied with electric current by means of cables 20.

In the activated position the electromagnet 4 acts in a pulling manner on the pole piece 5 which therefore moves upwards and takes with it the core 18 such that the O-seal 10 is maintained pressed against the upper wall 13.

Thereafter the substrate 16 can be removed or a new substrate can be placed onto the core 18.

After these operations are performed the sealing cap 2 is replaced whereafter the activation of the electromagnet 4 can be stopped. Thereafter the inner sealing disc 3 moves back to its opened position under the influence of the diaphragm 11, which cooperates with the core 18 and the table 12. Because the electromagnet, which is necessary for moving the lock, co-operates with a core which is made of a magnetisable material the eventual remanent magnetism may cause problems. This remanent magnetism may be so strong that the normal operation of the lock can be hampered. For this problem two solutions are proposed.

According to the first solution the rubber O-seal 10 is selected so thick that in the closed position wherein the O-seal is pressed against the opposite metal parts, a certain air gap is maintained between the upper and lower wall. That implies that the magnetic circuit also comprises, apart from the electromagnet itself and the components which are forming the core, an air gap. The influence of said air gap is that the magnetic flux through the core is restricted so that the maximum attracting force is less than the "spring" force of the O-ring. Because of this restriction the forming of remanent magnetism is also strongly restricted and the eventual small amount will not cause problem.

Figure 3:
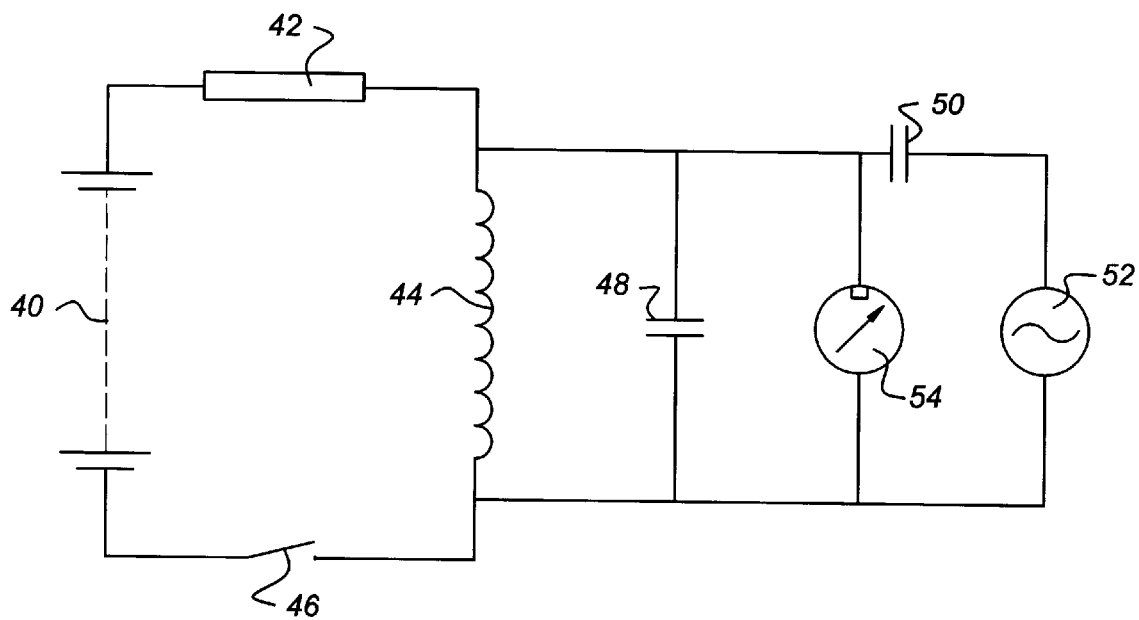
FIG. 3 illustrates an electrical circuit to prevent remanent magnetism.

According to a second solution a capacitor is placed parallel to the coil of the electromagnet. Reference is made to FIG. 3 in which the coil of the electromagnet 4 is indicated by 44. The circuit for activating this coil 44 comprises the DC voltage source 40, a current restricting resistor 42 and a switch 46. According to the second solution to avoid remanent magnetism a capacitor 48 is placed parallel to the coil 44. The influence of this capacitor 48 in the situation wherein the switch 46 is closed is negligible. If it is assumed that the real impedance of the coil 44 is rather small then the charge, which will accumulate on the capacitor 48, is also rather small and negligible. If the switch 46 is opened then in the first instance the coil 44 will try to maintain its current and will start charging the capacitor 48. The capacitor 48 is charged in a direction opposite to the polarity of the DC source 40. As soon as the charging process is stopped the capacitor 48 starts uncharging across the coil 44 with the result that a current in the other direction will run through the coil 44 which therefore will generate an electric field which counteracts the eventual remanent magnetism. In fact the coil 44 and the capacitor 48 are forming a parallel LC-circuit with a certain own frequency of which the value is determined by the impedance values of the coil 44 and of the capacitor 48. In case the power supply to such a circuit is disrupted, then the circuit starts generating a damped AC oscillation, which after a number of waves will be reduced to zero. Because of this phenomenon no remanent magnetism will develop in the core or other magnetisable parts of the magnetic circuit.

A small extension of the electric circuit illustrated in FIG. 3 provides the possibility to detect the position of the movable lock section. This circuit extension comprises the capacitor 50, the AC voltage source 52 and the AC voltage measuring instrument 54. The capacitor 50 functions on the one hand as DC block, so that the functioning of the DC circuit 40, 42, 44, 46 is in fact not influenced. Together with the capacitor 48 the capacitor 50 forms an AC voltage divider so that a part of the AC voltage supplied by the source 52 is imprinted on the LC circuit 44/48.

As long as the switch 46 is closed a DC current will run through the coil 44, so that the electromagnet is activated and the door is maintained in its closed position. In that situation the magnetic flux of the electromagnet runs (with the exception of an eventual small air gap) only through magnetisable material so that the self-induction of the coil 44 is rather high. The AC voltage meter 54 indicates a correspondingly high value.

If the switch 46 is opened no current will run anymore through coil 44 and the electromagnet will fall off bringing the lock in its opened position. In this position there is a rather large air gap within the magnetic flux circuit so that the impedance of the coil 44 will be rather low. The AC voltage meter 54 will indicate a correspondingly rather low voltage value.

If for whatever reason (for instance a remanent magnetism) the lock will be in the closed position although the switch 46 is opened the meter 54 will indicate a rather low value which for the operating personnel of this installation forms a sign that there is something wrong in the installation because the lock is still closed where it has to be opened. The inverse situation will arise in case the lock is open although it should be closed. In fact, the lock can be guarded in this manner by the operating personnel.

To avoid energy loss the resistor 42 can be replaced by a coil. In that case a damping element (a diode, a varistor or resistor) should be placed parallel to that coil to dampen the voltage peak which will be generated as soon as the switch 46 will be opened.

What is claimed is:

1. Lock for a vacuum chamber, comprising:
   a passage having an outer sealing means and an inner sealing means,
   said outer sealing means being maintainable in a closed position under an influence of a pressure difference caused by a vacuum in the vacuum chamber, and being movable to a first open position against a force caused by said pressure difference, said inner sealing means under pretension can be maintained in a second open position and comprises closing means for closing the inner sealing means against said pretension, wherein the closing means comprise at least one electromagnet.

2. Lock according to claim 1, whereby the electromagnet (4) is present near the passage (1) of the vacuum chamber (6).

3. Lock according to claim 2, whereby the electromagnet (4) extends around said passage (1).

4. Lock according to claim 3, whereby the closing means include a pole piece (5).

5. Lock according to claim 4, whereby the pole piece (5) is connected to the inner sealing means (3).

6. Lock according to claim 5, whereby the pole piece (5) extends correspondingly over the inner sealing means (3).

7. Lock according to claim 6, whereby the passage (1) as well as the inner sealing means (2) and the outer sealing means (3) are cylindrical.

8. Lock according to claim 7, wherein the pole piece has at least one of an annular ridge and a groove at a surface facing the electromagnet, and an area around the passage has at least a correspondingly situated groove or ridge, so that said ridge can be inserted within said groove when the passage is sealed by the inner sealing means.

9. Lock according to claim 8, whereby the outer sealing means (2) comprises an annular O-seal (9) which can be pressed on under the influence of the pressure difference, caused by the vacuum.

10. Lock according to claim 9 whereby the annular O-seal is selected so thick teats in the closed position wherein the annular O-seal is pressed against opposing upper and lower walls of said inner seal, a certain air gap is maintained between the upper and lower walls.

11. Lock according to claim 8, whereby the inner sealing means comprises an annular O-seal, which can be compressed when the electromagnet is activated.

12. Lock according to claim 8, whereby the inner sealing means (3) is pre-tensioned by a diaphragm spring (11).

13. Circuit for avoiding the effect of remanent magnetism in a lock according to claim 8, comprising a DC voltage source, a switch, a coil of the electromagnet and a damping element in series, and a capacitor in parallel to said coil.

14. Circuit according to claim 13, further comprising a measuring branch connected in parallel to said capacitor, said measuring branch consisting of an AC voltage source in series with a dividing capacitor and in parallel to said capacitor and an AC voltage measuring device in parallel to said capacitcator.

15. Lock according to claim 1, whereby the closing means comprise a second electromagnet or permanent magnet which is connected to inner sealing means.

16. Vacuum chamber comprising:

at least one lock having a passage with an outer sealing means and an inner sealing means; and a table, said table being displaceable along the passage and carrying said inner sealing means, said outer sealing means can be maintained in a closed position under an influence of a pressure difference caused by a vacuum in the vacuum chamber and can be maintained in a first open position against a force generated by said pressure difference, said inner sealing means can be maintained in a second open position under pretension and comprising closing means for closing the inner sealing means against said pretension, wherein the closing means comprise an electromagnet.

17. The vacuum chamber according to claim 16, wherein the passage is cylindrical and the vacuum chamber further comprises a drum-shaped housing with a cylindrical surrounding wall and two end walls at both ends of said cylindrical surrounding wall, one of said two end walls having said cylindrical passage and an outer vacuum cap, said table being mounted in said housing in a coaxially rotatable manner.

* * * * *